United States Patent [19]

Mori et al.

[11] Patent Number: 5,281,871
[45] Date of Patent: Jan. 25, 1994

[54] MAJORITY LOGIC CIRCUIT

[75] Inventors: Toshihiko Mori; Motomu Takatsu, both of Kawasaki, Japan

[73] Assignee: Fujitsu Limited, Kawasaki, Japan

[21] Appl. No.: 795,472

[22] Filed: Nov. 21, 1991

[30] Foreign Application Priority Data

Nov. 21, 1990 [JP] Japan .................. 2-314088

[51] Int. Cl.$^5$ .................. H03K 19/013
[52] U.S. Cl. .................. 307/454; 307/471; 307/322
[58] Field of Search .......... 307/454, 471, 472, 299.1, 307/322

[56] References Cited

U.S. PATENT DOCUMENTS

| | | | |
|---|---|---|---|
| 3,230,387 | 1/1966 | Gruddis et al. | 307/471 |
| 4,849,934 | 7/1989 | Yokyoyama et al. | 307/322 |
| 4,868,418 | 9/1989 | Imamura et al. | 307/322 |

FOREIGN PATENT DOCUMENTS 934306 11/1961 United Kingdom ............... 307/322

Primary Examiner—Edward P. Westin
Assistant Examiner—Andrew Sanders
Attorney, Agent, or Firm—Staas & Halsey

[57] ABSTRACT

A logic circuit including a transistor having a control electrode connected to three input terminals at which are received three respective input signals, each having, selectively, either a high or a low voltage level, and first and second electrodes, one thereof connected to a first power supply potential and the other thereof connected through a diode having N-type negative differential resistance to a second, lower power supply potential. An output terminal is connected to one of the first and second electrodes of the transistor for deriving an output signal. The load lines of the transistor are set to a first operating point for both a first condition in which all three input signals are at a low voltage level and also a second condition in which two thereof are at a high level and the third is at a low level, and to a second operating point for both a third condition in which only one of the input signals is at the high level and the remaining two input signals are at the low level and also a fourth condition in which all of the three input signals are at the high level. The current conducted by the transistor is at a first level for the first operating point and at a second level, greater than the first level, for the second operating point.

26 Claims, 6 Drawing Sheets

MAJORITY LOGIC CIRCUIT

BACKGROUND OF THE INVENTION

1. Field of the Invention

This invention relates to an exclusive-OR or an exclusive-NOR and/or a majority logic circuit.

2. Description of the Prior Art

A full adder is known as one of the elements that constitute an arithmetic circuit in a computer, or the like.

Such a full adder comprises a three-input exclusive-OR circuit and a three-input majority logic circuit. Among the exclusive-ORs, an Ex-OR is a logic circuit which produces an L level output signal when the number of input signals having an H level is even-numbered and an H level output when the input number is odd-numbered. Assuming that the three inputs are A, B and C and the output is Q, the logic can be expressed as follows:

$$Q = A + B + C = ABC + \overline{A}\overline{B}C + A\overline{B}\overline{C} + \overline{A}B\overline{C}$$

When this logic is achieved by ordinary NAND gates or NOR gates, several gates must be combined and a large number of transistors must be used.

A three-majority logic circuit outputs an L level when the number of the input signals having the H level is 0 or 1 and outputs an H level when the number of the input signals having the H level is 2 or 3. This logic can be expressed as follows with the output being P:

$$P = AB + BC + CA$$

Therefore, a large number of transistors must be used, too, in the same way as the exclusive-OR.

Attempts have been made to reduce the number of necessary transistors by forming an exclusive-OR or a majority logic circuit by the use of transistors having negative conductance, but they involve the problems that specific transistors must be used to achieve said logic circuit and a large number of resistors are necessary. Accordingly, these attempts have failed to afford an integral structure of the exclusive-OR circuit and the majority logic circuit, thereby to reduce the number of necessary transistors.

The present invention is directed to providing an exclusive-OR circuit, a majority logic circuit and furthermore, a full adder, each having a reduced number of constituent devices by overcoming the drawbacks of the prior art described above and reducing drastically the numbers of transistors and diodes that have been necessary in the prior art logic circuits, while using existing transistors and diodes.

SUMMARY OF INVENTION

In order to accomplish the object described above, the present invention employs the following technical construction.

According to the fundamental construction of the present invention, a diode having N-type negative differential resistance is interposed between ground and the emitter or the source of a transistor, the base or gate of which is connected to three input terminals; load lines of this transistor are set to a first type operation point, at which an output current scarcely flows when all of the three input signals input to the three input terminals are at the L level or when two of them are at the H level, and to a second type operation point, at which a greater output current flows than at the first type operation point when the number of the input signals having the H level is 1 or 3, and an exclusive-OR or exclusive-NOR output is obtained from a terminal disposed at the collector or drain of the transistor. This is the first embodiment of the present invention.

According to a second embodiment of the present invention, a diode having N-type negative differential resistance is interposed between ground and the emitter or source of a transistor, the base or gate of which is connected to three input terminals. An output voltage produced at an output terminal, connected between the emitter of the transistor and the diode, is allowed to change in accordance with the number of the input signals input to the three input terminals; particularly, the output voltages, which are produced when the number of the input signals having the H level is greater than the number of the input signals having the L level, and the output voltages, which are produced when the former is smaller than the latter, are adjusted so as to be divided by a predetermined voltage value, the latter being set between a peak voltage value and a valley voltage value of the diode having N-type negative differential resistance. Further, a discriminating circuit having a predetermined threshold voltage value, between the peak voltage value and the valley voltage value, is connected to the output terminal, so as to obtain a majority logic output.

DESCRIPTION OF THE PREFERRED EMBODIMENTS

Hereinafter, preferred embodiments of the present invention will be described in detail with reference to the accompanying drawings.

Figure 1:
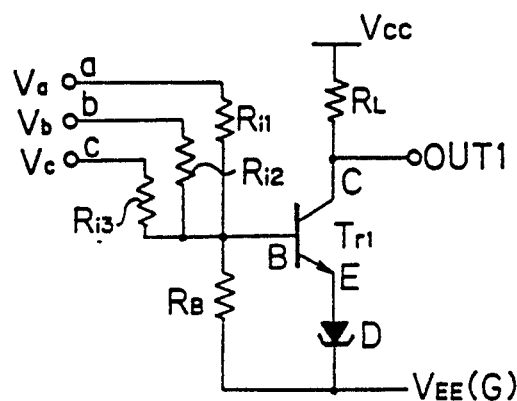
FIG. 1 is a circuit diagram showing a structural example of an exclusive-OR circuit as a specific embodiment of the logic circuit in accordance with the present invention, and is also an explanatory diagram useful for explaining the principle of the present invention.

FIG. 1 shows a structural example of an exclusive-NOR (EX-NOR) circuit, among exclusive-OR circuits, as an embodiment of a logic circuit in accordance with the present invention.

In this circuit, diode D having N-type negative differential resistance is interposed between the ground G and an emitter E of a bipolar transistor Tr1, the base B of which is connected to three input terminals a, b and c through resistors Ri1, Ri2 and Ri3, respectively. Signals having input voltages Va, Vb, Vc are applied as input signals to the three input terminals a, b, and c described above, respectively.

An output terminal OUT1 is connected to the collector C of the bipolar transistor Tr1, and this collector C is connected to a high potential power supply Vcc through a load resistor $R_L$, for example.

The other end of the diode D having N-type negative differential resistance may be connected to a predetermined low potential power supply $V_{EE}$ in the alternative to ground (G).

In the embodiment of the present invention shown in FIG. 1, the base of the transistor Tr1 is connected to the ground (G) or $V_{EE}$, in parallel to the diode D having N-type negative differential resistance, through a resistor $R_B$.

In the present invention, furthermore, the transistor Tr1 is not particularly limited, and ordinary transistors of any type can be used.

For example, it is possible to use bipolar transistors, field effect transistors (FETs), electrostatic induction transistors (SITs), and so forth. The conductivity type of such transistors is not particularly limited, either, and a PNP type, an NPN type or an N-channel type or a P-channel type can be appropriately selected and used, within the scope in which the object of the invention can be accomplished.

Figure 3:
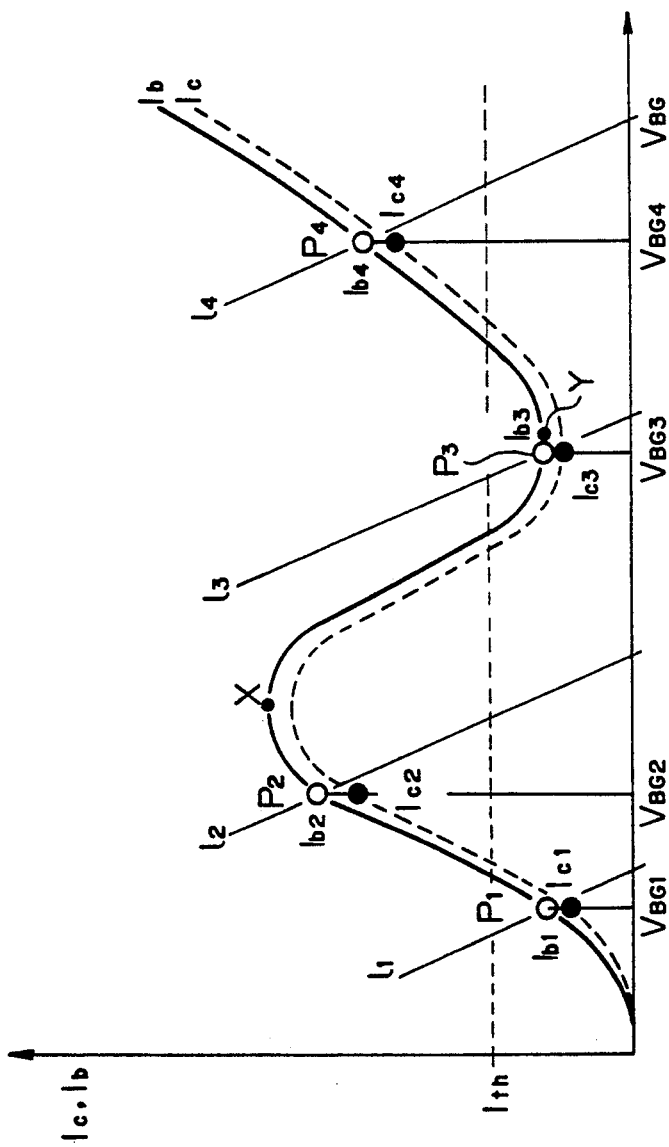
FIG. 3 is a diagram showing current-v-voltage characteristics of the logic circuit in accordance with the present invention.

Any diode type can be used as the diode D having N-type negative differential resistance in the present invention so long as they have negative resistance in a predetermined condition in which the differential value of a current remains constant with respect to the increase of a base voltage, a typical such characteristic being shown in FIG. 3.

For example, it is possible to use resonance tunnel diodes, Esaki diodes, real space transition type negative resistance devices, and so forth.

The embodiment of the present invention has a circuit construction as described above. The input signals, input to the three input terminals a, b and c, are generally binary signals having an H level or an L level. When the input signals are at the H level, for example, the input voltages become Va, Vb and Vc, respectively. Such input signals are generally supplied from a logic circuit, serving as a pre-stage circuit to the logic circuit of the present invention, and the voltage Va, Vb, Vc of the H level of each input signal is believed to be equal (Va=Vb=Vc).

The input signals to be applied to the three input terminals may be an augend, an addend or a carry signal from the pre-stage logic circuit described above.

Furthermore, the input resistors Ri1, Ri2 and Ri3 preferably have a common resistance value.

In the exclusive-OR circuit shown in FIG. 1, the diode D having N-type negative differential resistance is interposed between the emitter of the transistor Tr1 and the ground. Therefore, the voltage, between the base of the transistor Tr1 and the ground, the collector current Ic and the base current Ib have current-voltage characteristics as shown in FIG. 3.

Accordingly, the operation of the circuit shown in FIG. 1 is determined by the base voltages and which are in turn determined from the points of intersections $P_1$, $P_2$, $P_3$, $P_4$ between load lines $l_1$-$l_4$, which depend on the input voltages V1, V2, V3, V4 and the resistances $R_B$, Ri1, Ri2, Ri3, and the Ib curve. Since this resistance value (Ri1-Ri3) is selected at a relatively low value, the circuit described above is substantially voltage-driven. Assuming hereby that the respective resistance values of resistors Ri1-Ri3 are equal, therefore, the voltage obtained by dividing the mean value of these three inputs by Ri/3 and $R_B$ can be regarded as being applied between the base and the ground.

Accordingly, the load line $l_1$ is set so that the levels of the three inputs are all at the L level; $l_2$ is set so that only one of the three inputs is at the H level with the others being at the L level; $l_3$ is set so that two of the three inputs are at the H level with the other being at the L level; and $l_4$ is selected so that all of the three inputs are at the H level. Then, the resistance value of each resistor is selected in conjunction with the points of intersection $P_1$-$P_4$ between the load lines $l_1$-$l_4$ and the Ib curve so that the point of intersection $P_1$ exists near a rise voltage, $P_2$ exists near a peak voltage, $P_3$ exists near a valley voltage and $P_4$ exists near a voltage at which a current flows substantially to the same extent as $P_2$ after the valley. According to this arrangement, if the circuit of this embodiment as shown in FIG. 1 is constituted so as to output the high level output OUT1 when the number of input signals at H level is even-numbered and to output the low level output OUT1 when the number of input signals at the H level is odd-numbered, then, the circuit functions as a three-input exclusive-NOR circuit.

In other words, in the present invention, the point of intersection between each of the load lines $l_1$-$l_4$ and the voltage axis $V_{BG}$ is determined by the total voltage of each signal input to the input terminals and the respective resistors and the gradient of each load line $l_1$-$l_4$ is determined by the resistors. Assuming that the impedance at the pre-stage of the input terminals Va, Vb, Vc does not change between the time of the H level and the L level in the present invention, each load line $l_1$-$l_4$ is believed to be parallel to each other.

The load lines $l_1$-$l_4$ can be set to respective predetermined states by appropriately changing and setting the input voltage level, the resistance values, the driving capacity of the transistor and the like, while taking the above into consideration.

Figure 2:
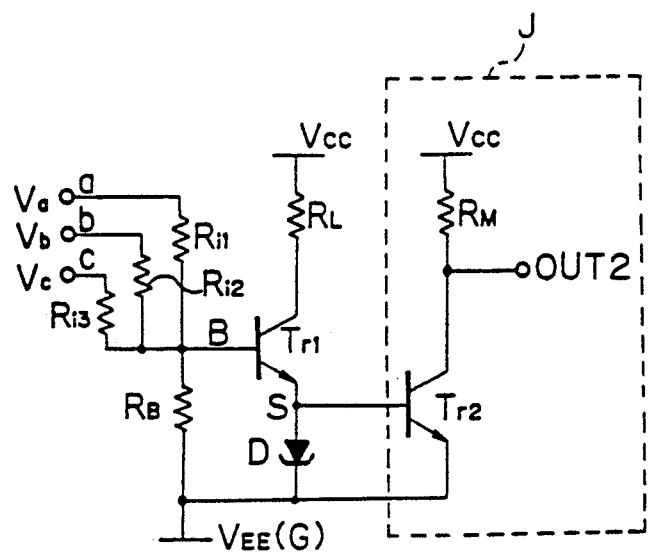
FIG. 2 is a circuit diagram showing a structural example of a majority logic circuit as another embodiment of the logic circuit in accordance with the present invention.
Figure 4:
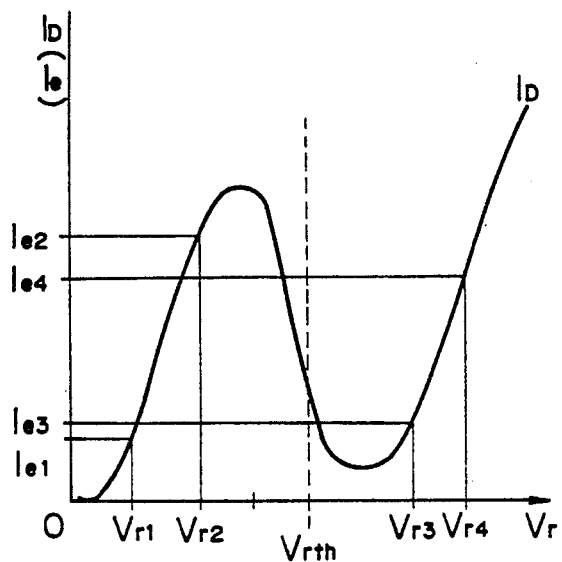
FIG. 4 is a diagram showing voltage-v-current characteristics of a diode having N-type negative differential resistance in accordance with the present invention.

FIG. 2 shows an embodiment of a majority logic circuit in accordance with the present invention. The diode D having N-type negative differential resistance is interposed between the emitter of the transistor Tr1 and the ground. Therefore, the output terminal can be provided at a connection between the emitter of the transistor Tr1 and the diode D having the N-type negative differential resistance, and the relation between the voltage across the diode D having N-type negative differential resistance and the current is substantially the same as the current characteristics shown in FIG. 3. Therefore, assuming that the current at each point of intersection $P_1$-$P_4$ between each load line $l_1$-$l_4$ and the emitter current curve Ic is equal to the current shown in FIG. 4, the voltage Vr1-Vr4 across the diode D when this current flows can be determined from FIG. 4.

In the circuit of the present invention shown in FIG. 2, therefore, the output terminal between the emitter of the transistor Tr1 and the diode D having N-type negative differential resistance is constituted so as to change in accordance with the number of input signals having the H level, among the input signals input to the three input terminals, and the output voltages obtained when the number of input signals having the H level is greater than that of the input signals having the L level, and the output voltages obtained when the former is smaller than the latter, are divided by a predetermined voltage between the peak voltage value and valley voltage value in the current-v-voltage characteristics of the diode having N-type negative differential resistance.

Accordingly, the logic, corresponding to the majority logic circuit or the carry circuit, can be executed by inputting the voltages of the output terminal to a suitable discrimination circuit, setting the threshold value of this discrimination circuit to a value between Vr2 and Vr3 and operating the circuit in such a manner as to output the L level signal when the number of the input signals having the H level, among the input signals, is 1 or below 1 and to output the H level signal, when the number of H level input signals is 2 or more than 2.

When the two circuits described above are combined, the resulting circuit can operate as a full adder.

Next, the operation of the logic circuit in this embodiment will be explained. First of all, since this circuit includes the diode having N-type negative differential resistance connected to the emitter of the transistor as shown in FIG. 2, the currents flowing through the logic circuit, particularly the emitter current Ie and the collector current Ic of this transistor Tr1, exhibit the N-type negative resistance relatively to the base voltage $V_{BG}$ and each exhibits a characteristic curve describing the same peak value X and valley value Y.

Here, if the load lines $l_1$–$l_4$, as determined by the voltages Va, Vb, Vc of the input signals, the input resistors Ri1, Ri2, Ri3 and the resistor $R_B$, are drawn, the points of intersection $P_1$, $P_2$, $P_3$, $P_4$ between these load lines $l_1$–$l_4$ and the base current Ib define the respective emitter current value Ib ($Ib_1$, $Ib_2$, $Ib_3$, $Ib_4$) when the circuit operates at each of the corresponding load lines.

Similarly, each collector current Ic ($Ic_1$, $Ic_2$, $Ic_3$, $Ic_4$) and each base voltage $V_{BG}$ ($V_{BG1}$, $V_{BG2}$, $V_{BG3}$, $V_{BG4}$), at each of the points of intersection $P_1$, $P_2$, $P_3$, $P_4$, can be determined.

In other words, such collector currents $Ic_1$, $Ic_2$, $Ic_3$, $Ic_4$ and base voltages $V_{BG1}$, $V_{BG2}$, $V_{BG3}$, $V_{BG4}$ represent the collector current and the base voltage of the transistor Tr1 when operating at the respectively corresponding load lines.

Accordingly, if these input resistors Ri1, Ri2, Ri3 are set to relatively low values, this logic circuit can be voltage-driven. Therefore, the voltage, obtained by dividing the mean value of the signals input to the three input terminals by Ri/3 and the resistor $R_B$, can be regarded as the voltage applied between the base of the transistor Tr1 and the ground.

Therefore, the load line $l_1$, among the plural load lines, is made to correspond to the condition in which the levels of the signals input to the three input terminals are all L level, the load line $l_2$ to the condition in which only one of the signals input to the three input terminals is at the H level with the other signals being at the L level, the load line $l_3$ to the condition in which two signals, among the three signals input to the three input terminals, are at the H level with the other being at the L level, and the load line $l_4$ to the condition in which the levels of all the signals input to the three input terminals are at the H level. Furthermore, in connection with the base voltages $V_{BG1}$, $V_{BG2}$, $V_{BG3}$ and $V_{BG4}$ at the points of intersection $P_1$, $P_2$, $P_3$, and $P_4$ between these load lines and the characteristic curve of the collector current Ic, the resistance values are selected to that the voltage $V_{BG1}$ when the number of input signals that are at the H level, is 0, that is, when the load line $l_1$ exists near the rise voltage, the voltage $V_{BG2}$ when this number is 1, that is, when the load line $l_2$ exists near the peak voltage, the voltage $V_{BG3}$ when this number is 2, that is, when the load line $l_3$ exists near the valley voltage, and the voltage $V_{BG4}$ when the number is 3, that is, when the load line $l_4$ is a voltage at which the current flows after the valley.

Then, the collector current Ic flowing through the transistor Tr1 at each operation point can be taken out by the load resistor $R_L$ as the voltage from the output terminal. Note, that the collector current is converted to the output voltage by the load resistor $R_L$.

In other words, the logic circuit is set so that the current hardly flows at the base voltages $V_{BG1}$, $V_{BG3}$ and the output is at the H level and on the other hand, this current can sufficiently flow when the base voltages are $V_{BG2}$, $V_{BG4}$ and the output is at the L level.

If the former state is regarded as the second type operation point and the latter as the first type operation point, and if a suitable threshold value $I_{th}$ is set, relatively to and between the respective output currents for the first and second type operating points, the first and second type operation points can be sufficiently distinguished. By employing such a circuit construction, the output of the logic circuit of this embodiment is at the H level when the number of the input signals having the H level is 0 or even-numbered and is at the L level when the number of the input signals having the H level is odd-numbered. It can thus be understood that this logic circuit becomes a three-input exclusive-OR circuit having inversion outputs.

Though the embodiments given above explain the exclusive-NOR circuit, the present invention is not particularly limited thereto but may of course be an exclusive-OR logic circuit.

Next, FIG. 2 illustrates a structural example of a majority logic discriminating circuit as another embodiment of the logic circuit in accordance with the present invention.

Since this circuit fundamentally uses the logic circuit shown in FIG. 1, only the circuit portion different from the circuit of FIG. 1 will be explained.

In other words, in the majority logic discriminating circuit of the present invention, the diode D having N-type negative differential resistance is interposed between the emitter E of the transistor Tr1, whose base B is connected to the three input terminals a, b, c through the resistors Ri1, Ri2, Ri3, respectively, and the ground G, and the signals having the input voltages Va, Vb, Vc are input to the three input terminals, respectively.

The collector C of the transistor Tr1 is connected to a high potential power supply Vcc, for example, through the load resistor $R_L$.

The other end of the diode D having N-type negative differential resistance alternatively may be connected to a low potential power supply $V_{EE}$.

The base of the transistor Tr1 is connected to the ground of the diode D having N-type negative differential resistance through the resistor $R_B$.

In this embodiment, there is provided a transistor Tr2 whose base is connected to the node S between the emitter E of the transistor Tr1 and the diode D having N-type negative differential resistance. The output terminal OUT2 is disposed at the collector C of this transistor Tr2 and at the same time, this collector C is connected to the high potential power supply Vcc, for example, through a load resistor $R_M$.

On the other hand, the emitter E of the transistor Tr2 is connected to the ground or to the low potential power supply $V_{EE}$.

The operation of this circuit is now explained. The operation of the circuit portion, that consists of the transistor Tr1 and the diode D having N-type negative differential resistance, is the same as that of the circuit shown in FIG. 1, assuming that the input signals to the three input terminals are the same.

Accordingly, the current flowing through the transistor Tr1, too, is fundamentally the same, and is driven in accordance with the operation characteristics curve shown in FIG. 3.

Assuming that the logic circuit of this embodiment is driven under the same condition as that of the FIG. 1 embodiment already described, the voltage at the node S between the transistor Tr1 and the diode D having N-type negative differential resistance will be examined.

The current in accordance with the characteristics curve shown in FIG. 3 should flow at the node S in the same way as described above.

Therefore, each emitter current $IB_1$, $IB_2$, $IB_3$, $IB_4$, at the corresponding points of intersection $P_1$, $P_2$, $P_3$, $P_4$ between the respective load lines $l_1$–$l_4$ and the characteristics curve of the emitter current Ie, flows through the diode D having N-type negative differential resistance.

However, the terminal voltage across this diode D is the voltage obtained by subtracting the threshold voltage of the transistor Tr1 from its base voltage.

It is therefore possible to obtain each voltage $Vr_1$, $Vr_2$, $Vr_3$, $Vr_4$, at the node between the emitter of the transistor Tr1 and the diode, when each emitter current $Ib_1$, $Ib_2$, $Ib_3$, $Ib_4$ flows, by putting each emitter current value $Ib_1$, $Ib_2$, $Ib_3$, $Ib_4$. described above, on the current-v-voltage characteristics curve of the diode having N-type negative differential resistance.

It can be understood from the description given above that in the circuit of the present invention shown in FIG. 2, the output at the node S, between the emitter of the transistor Tr1 and the diode D having N-type negative differential resistance, changes in accordance with the number of input signals having the H level among the input signals input to the three input terminals.

Therefore, there is provided a suitable discriminating circuit, such as the discriminating circuit J consisting of the transistor Tr2, the base of which is connected to the node S shown in FIG. 2. The threshold value $V_{th}$ of this discriminating circuit is set to a value between the voltages Vr2 and Vr3 so that the discriminating circuit outputs the H level signal when the number of the input signals having the L level, among the plural input signals, is 1 or below and outputs the L level signals when the number of the input signals having the H level is at least 2, among the plural input signals. In this manner, this logic circuit constitutes a majority logic circuit having the inversion output.

The specific discriminating circuit J used in the present invention is not particularly limited to the circuit shown in FIG. 2, but any circuit and devices can be used so long as they have a construction that sets its threshold value so as to constitute the majority logic circuit, as to the output voltage at the node S, and can perform the discrimination.

Still another embodiment of the present invention combines the two embodiments given above and constitutes a full adder.

Figure 5:
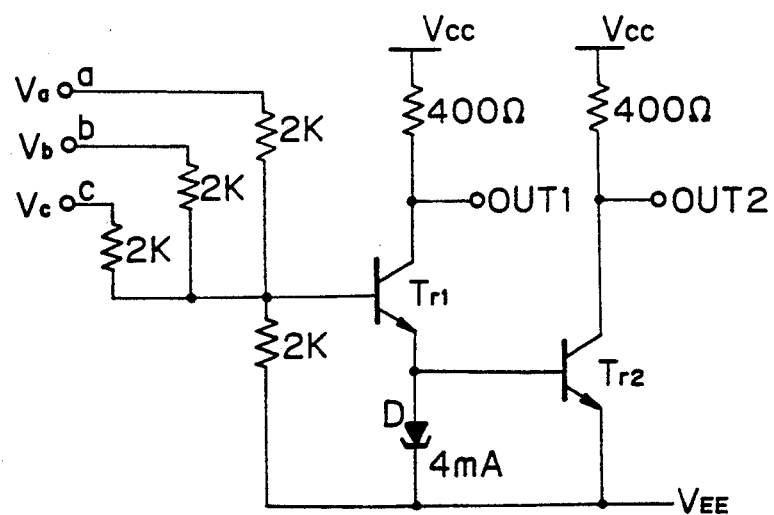
FIG. 5 is a circuit diagram showing a structural example of a full adder as still another embodiment of the present invention.

FIG. 5 shows circuit for accomplishing such a technical concept, and each function is the same as the one described above.

In this logic circuit, a bipolar transistor having a rise voltage of 0.7 V is used as the transistor Tr1, as the active element, and an AlGaAs/GaAs/AlGaAs resonance tunnel diode having a rise voltage of 2.0 V, a peak voltage of 0.6 V, a valley voltage of 1.0 V and a peak current of 4 mA is used as the N-type diode D having negative differential characteristics.

The resistance value of each resistor is set as shown in FIG. 5.

According to this circuit construction, the logic circuit produces an exclusive-OR logic output from the output terminal OUT1 and a majority logic output from the output terminal OUT2.

Though the description given above explains the circuit having the three input terminals by way of example, the three input terminals need not always be used particularly in the Ex-NOR circuit, and more than three input terminals can be used, as well.

In such a case, the functions and effects described above can be accomplished by disposing a plurality of diodes D having N-type negative differential resistance in series with one another.

Since the present invention employs the circuit construction described above, the exclusive-OR circuit, for example, can be constituted by one transistor and one diode, and the majority logic circuit can be constituted by two transistors and one diode.

Furthermore, if the full adder is to be constituted in accordance with the present invention, it can be constituted by two transistors and one diode as is obvious from FIG. 5.

Accordingly, the present invention can drastically reduce the number of transistors and diodes necessary for constituting the logic circuit in comparison with the prior art.

Figure 6:
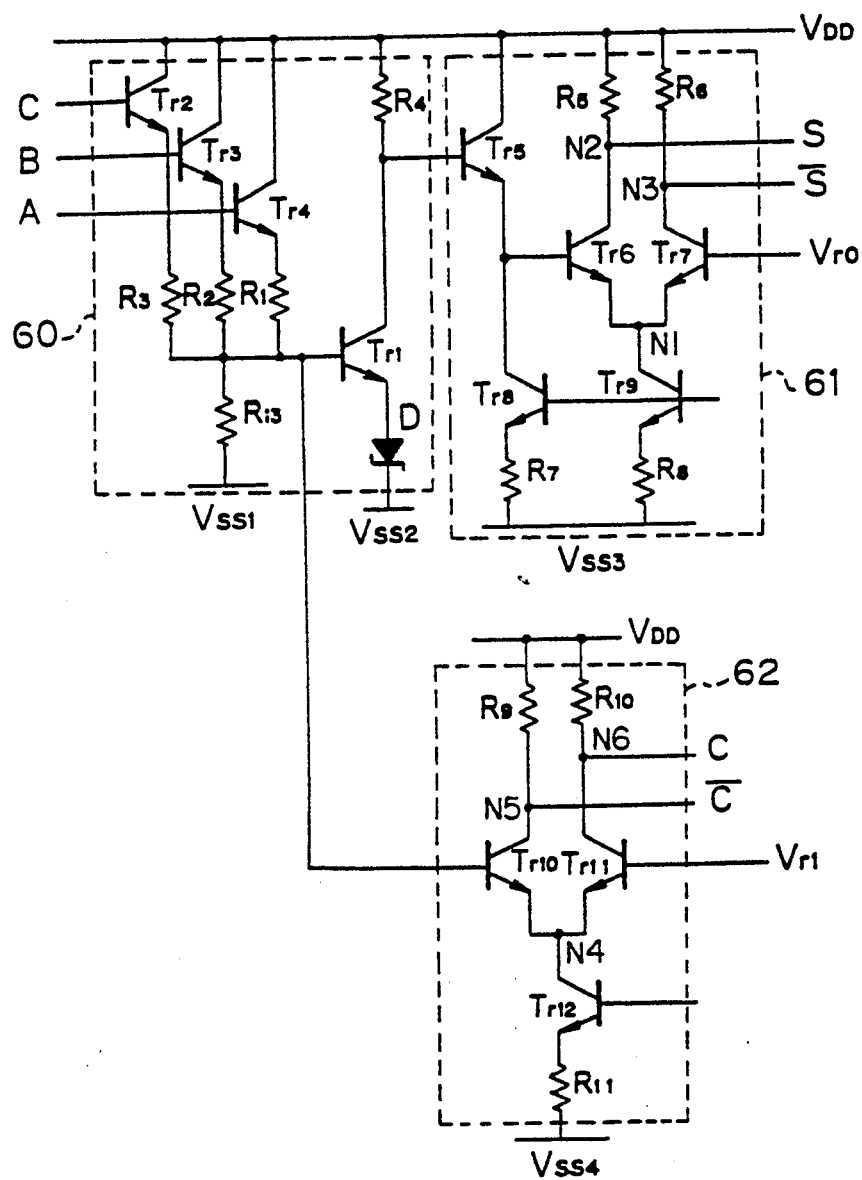
FIG. 6 is a circuit diagram showing another embodiment of the present invention.

FIG. 6 is a circuit diagram showing another embodiment of the full adder circuit of the present invention which is improved relatively to that shown in FIG. 1.

In FIG. 6, a circuit portion 60 is provided and wherein a bipolar transistor Tr1, a diode D having N-type negative differential resistance connected to an emitter of the bipolar transistor Tr1 and a resistor R4 are provided in the same configuration and the same function as shown in the circuit of FIG. 1.

The present embodiment, however, has a different construction from the circuit as shown in FIG. 1, in that the three input terminals A, B, and C are connected to respective resistors R1, R2 and R3 through respective, corresponding bipolar transistors Tr2, Tr3 and Tr4. Note, that these transistors Tr2, Tr3, and Tr4 are provided as emitter-follower transistors in a previous stage relative to transistors Tr1 and thus, they may be omitted in FIG. 6, when the case requires. Further, a resistor $R_B$ is connected to the base of the transistor Tr1, in the same way as shown in FIG. 1.

On the other hand, in the present embodiment, a circuit 61 serves as a buffer circuit of the exclusive NOR circuit 60 and in which a base of a transistor Tr5, forming an input portion of the NOR circuit 60, is connected to the collector of the transistor Tr1, the collector being connected to the high potential voltage source Vdd, and the emitter thereof being connected to a base of one of the bipolar transistors Tr6 and Tr7 which together form a differential amplifier. A reference signal Vr0 is input to the base of the other of the transistors Tr6 and Tr7.

Moreover, the emitter of the transistor Tr5 is also connected to the collector of a bipolar transistor Tr8 and the emitter thereof is connected to Vss or ground; a common node $N_1$ of the differential amplifier is connected to a collector of a transistor Tr9, the base of which is common to the base of the transistor Tr8 while the emitter thereof is connected to Vss or ground.

Complementary outputs S and $\bar{S}$ are connected to respective nodes $N_2$ and $N_3$ provided interconnecting the collectors of the transistors Tr6 and Tr7 and resistors R5 and R6, respectively, the other ends of resistors R5 and R6 being connected to the high potential voltage source Vdd.

In accordance with the present embodiment, a processing speed of the exclusive NOR circuit 60 can be improved. In this embodiment the circuit 61 is omitted.

In this embodiment, a majority logic circuit is formed by the circuit 60 and the circuit 62 which serves as a carry circuit. The logic circuit 62 comprises transistors Tr10 and Tr11 forming a differential amplifier and a common node $N_4$, to which the emitters of the respective transistors Tr10 and Tr11 are connected, is connected to a collector of a transistor Tr12, serving as a constant current means. The emitter of transistor Tr12 is connected to a low potential source through a resistor R11 and a base of one of the transistors Tr10 and Tr11 is connected to the base of the transistor Tr1 while the base of the other one of the transistors Tr10 and Tr11 is connected to a reference source Vr1.

Moreover, the complementary outputs C and $\bar{C}$ are connected to nodes $N_4$ and $N_5$ interconnecting the collectors of the transistors Tr10 and Tr11 and resistors R9 and R10, respectively, the other ends of resistors R9 and R10 being connected to high potential voltage source Vdd.

Figure 7:
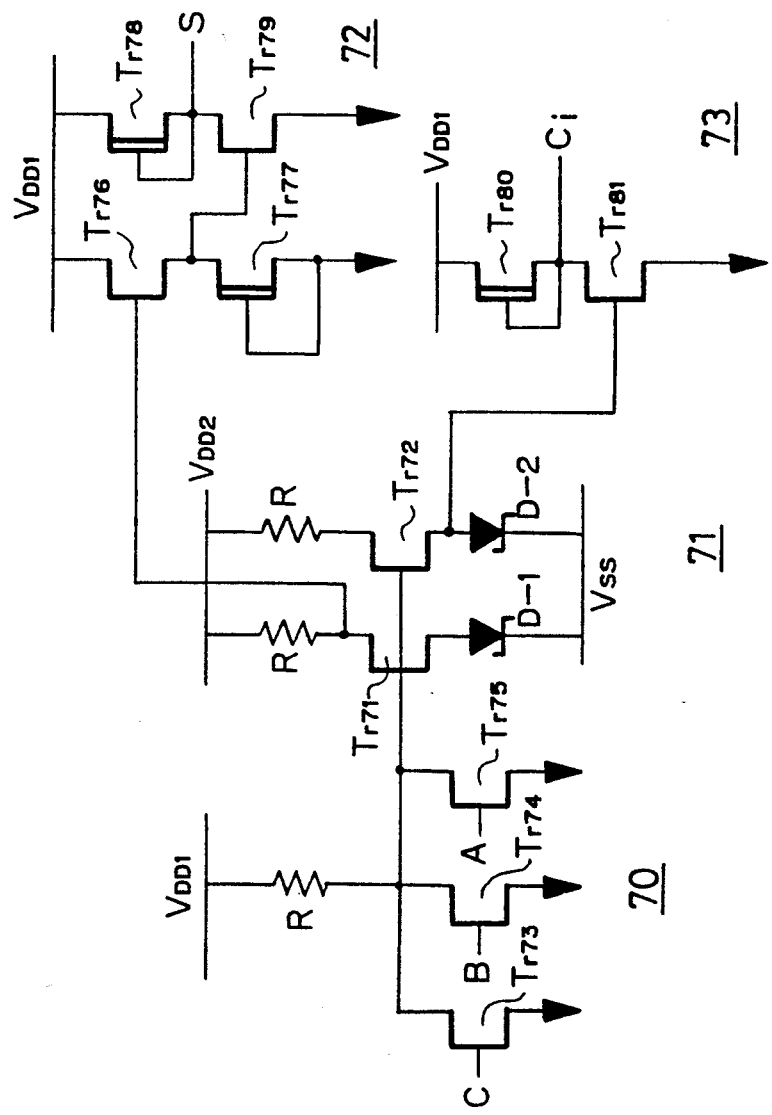
FIG. 7 is a circuit diagram showing yet another embodiment of the present invention.

FIG. 7 is a circuit diagram showing a further embodiment of a logic circuit in which a control circuit 70, an exclusive NOR circuit 71 and a majority logic circuit 72 and 73 are provided; therein, all of the transistors used comprise enhancement type and depletion type MOSFETs.

Note that in the exclusive NOR circuit 71, enhancement type MOSFETs Tr71 and Tr72 are arranged in parallel each other between a high potential power source Vdd2 and a low potential power source Vss and further a drain of each one of the enhancement type MOSFETs Tr71 and TR72 is connected to the high potential power source Vdd2 through a resistor R72 or R73 while the sources of the MOSFET Tr71 and Tr72 are connected to a low potential power source Vss through N-type diodes D1 and D2, respectively.

On the other hand, the respective gates of the MOSFETs Tr71 and Tr72 form a common gate to which the respective drains of enhancement type MOSFETs Tr73, Tr74 and Tr75 are connected while corresponding input signals A, B and C are input to the gates thereof, respectively.

Moreover, a resistor R71 has one end thereof connected to the high power source Vdd1 and the other end connected to the common gate of the MOSFETs Tr71 and Tr72 and thus to the respective drains of MOSFETs Tr73, Tr74 and Tr75.

In the present embodiment, a buffer circuit 72 of the exclusive NOR circuit 71 is connected to the drain of the enhancement type MOSFET Tr71 and the majority logic circuit is formed by the circuits 71, above, and 73, the latter connected to the source of the enhancement type MOSFET Tr72.

The buffer circuit 72 comprises two enhancement type MOSFETs Tr76 and Tr79 and two depletion type MOSFETs Tr77 and Tr78, each interconnected with each other as shown in FIG. 7.

In this buffer circuit 72, the enhancement type MOSFET Tr76 and the depletion type MOSFET Tr77 form a level shifting circuit, which functions to shift the output level of the circuit 71 so as to conform with a suitable input level for an invertor circuit comprising the enhancement type MOSFET Tr78 and the depletion type MOSFET Tr79.

Further, in this embodiment of the majority logic circuit formed by the circuits 71 and 73, the latter of which serves as a carry circuit, and the circuit 73 comprises an enhancement type MOSFET Tr81 and a depletion type MOSFET Tr80 which are arranged relatively to each other as shown in FIG. 7.

In this embodiment, the input of the circuit 73 is connected to a node $N_{10}$ which interconnects the source of the enhancement type MOSFET Tr72 and the diode D2.

When the output levels of both the buffer circuit 72 and the majority logic circuit 73 are simultaneously changed, the output level of the majority logic circuit 73 is usually changed prior to that of the buffer circuit 72 and thus the change in the output level of the buffer circuit 72 will be delayed.

To avoid this problem, the inputs of the circuits 72 and 73 are connected to the respective MOSFETs Tr71 and Tr 72, the latter being arranged in parallel with each other.

Figure 8:
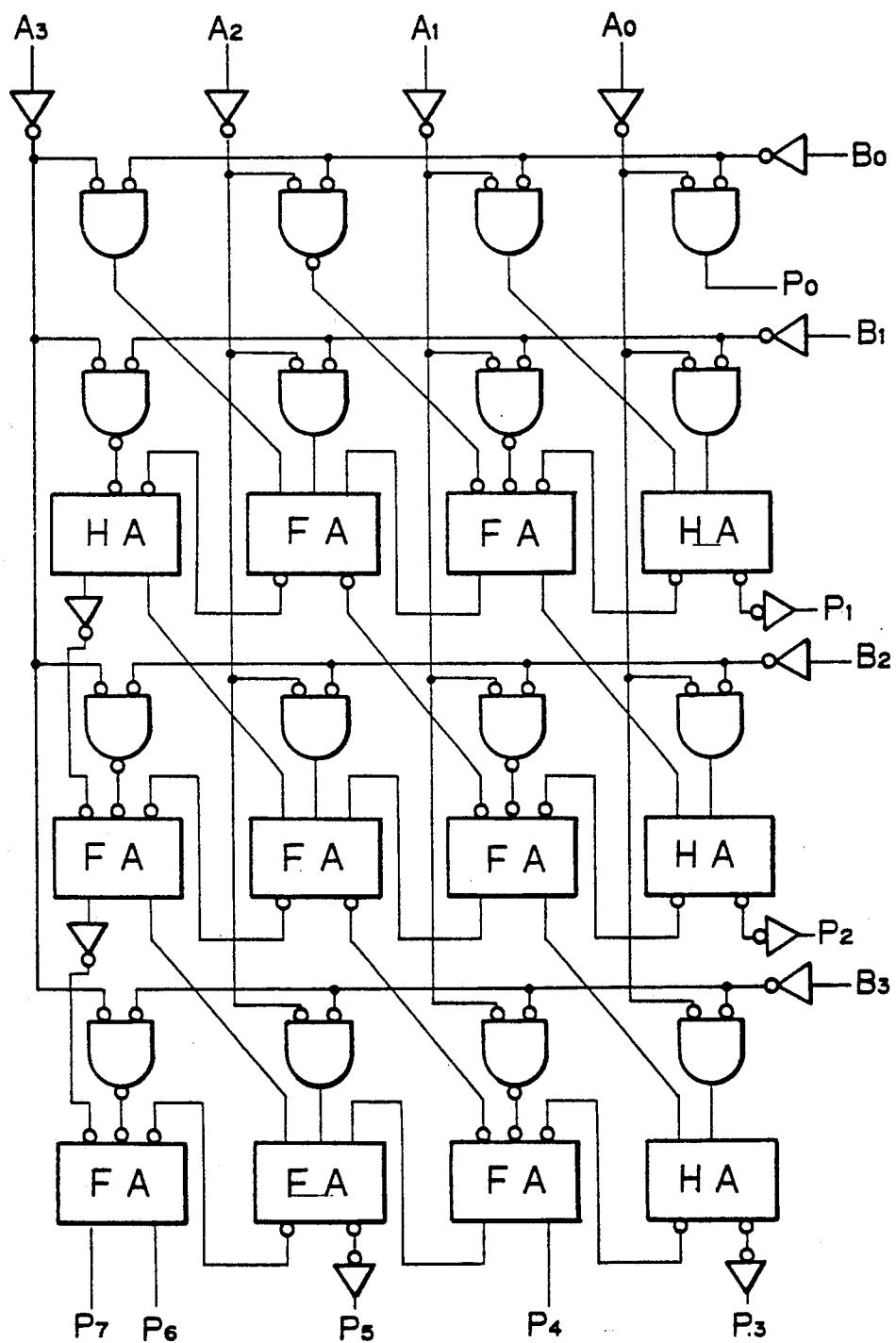
FIG. 8 is a circuit diagram showing one embodiment of a four bits multiplier, as one of the applicable devices of the present invention.

The logic circuit of the present invention can be applied in many circuit devices in various technical fields and one applicable embodiment of the present invention is shown in FIG. 8.

The circuit as shown in FIG. 8 is a four bits multiplier, in which one series of input data $A_0$–$A_3$ and another series of input data $B_0$–$B_3$ are input to this circuit and a series of output data $P_0$–$P_7$ are output therefrom.

The circuit comprises a plurality of full adders FA, a plurality of half adders HA, a plurality of NOR circuits and OR circuits and a plurality of invertor circuits; each of the full adders FA comprises the logic circuit as defined by the present invention and each of the half adders HA comprises either a conventional half adder circuit or the logic circuit of the present invention, in which a part of the function of the logic circuit is used.

We claim:

1. A logic circuit having first and second power source terminals and three input terminals for receiving three respective input signals, each of the input signals having, selectively, either a high level or a low level, and an output terminal, comprising:

a transistor having a first electrode connected to the first power source terminal, a second electrode and a control electrode connected to the three input terminals;

a diode, having N-type negative differential resistance, connected between the second electrode of the transistor and the second power source terminal;

the output terminal being connected to the first electrode of the transistor for deriving an output signal therefrom; and means for setting the load lines of the transistor to a first operating point wherein, for each of a first condition in which all of the three input signals are at a low level and a second condition in which two of the input signals are at a high level and a third of the input signals is at a low level, the current conducted by the transistor is at a first level, and to a second operating point wherein, for each of a third condition in which only one of the input signals is at the high level and the remaining two input signals are at the low level and a fourth condition in which all of the three input signals are at the high level, the current conducted by the transistor is at a second level, greater than the first level.

2. A logic circuit as recited in claim 1, further comprising:
a resistor having a first end connected at a node to the first electrode of the transistor and a second end connected to the first power supply terminal; and
the output terminal is connected to the node.

3. A logic circuit as recited in claim 1, wherein said transistor comprises a bipolar transistor.

4. A logic circuit as recited in claim 1, wherein said transistor comprises a field effect transistor.

5. A logic circuit as recited in claim 1, wherein said transistor comprises a static induction transistor.

6. A logic circuit as recited in claim 1, wherein said N-type diode comprises a resonance tunnel diode.

7. A logic circuit as recited in claim 1, wherein said N-type diode comprises an Esaki diode.

8. A logic circuit as recited in claim 1, wherein said N-type diode comprises a real space transition type differential characteristic resistance element.

9. A logic circuit having first and second power source terminals and three input terminals for receiving three respective input signals, each of the input signals having, selectively, either a high or a low level, and an output terminal, comprising:
a transistor having a first electrode connected to the first power source terminal, a second electrode and a control electrode connected to the three input terminals;
a diode, having N-type negative differential resistance, connected between the second electrode of the transistor and the second power source terminal; and
means connecting the output terminal to the second electrode of the transistor for deriving a voltage therefrom and producing a corresponding output voltage at the output terminal, the output voltage having a first voltage level when the number of the respective input signals, received by the three input terminals, having the high level is zero or one and the output voltage having a second voltage level, higher than the first voltage level, when the number of the respective input signals, received by the three input terminals, having the high level is two or three.

10. A logic circuit as recited in claim 9, wherein:
the diode has a current-versus-voltage characteristic having a peak in a first voltage range and a valley in a second voltage range higher than the first voltage range; and
the connecting means comprises a discrimination circuit which connects the output terminal to the second electrode of the transistor, the discrimination circuit establishing a discriminating voltage having a voltage level intermediate the first and second voltage ranges, and discriminating the voltage derived from the second electrode of the transistor relatively to the discriminating voltage and producing the output voltage, correspondingly and selectively of the first and second voltage levels.

11. A logic circuit as recited in claim 9, wherein said transistor comprises a bipolar transistor.

12. A logic circuit as recited in claim 9, wherein said transistor comprises a field effect transistor.

13. A logic circuit as recited in claim 9, wherein said transistor comprises a static induction transistor.

14. A logic circuit as recited in claim 9, wherein said N-type diode comprises a resonance tunnel diode.

15. A logic circuit as recited in claim 9, wherein said N-type diode comprises an Esaki diode.

16. A logic circuit as recited in claim 9, wherein said N-type diode comprises a real space transition type differential characteristic resistance element.

17. A logic circuit having first and second power source terminals and three input terminals for receiving three respective input signals, each of the input signals having, selectively, either a high level or a low level, and first and second output terminals, comprising:
a transistor having a first electrode connected to the first power source terminals, a second electrode and a control electrode connected to the three input terminals;
a diode, having N-type negative differential resistance, connected between the second electrode of the transistor and the second power source terminal;
the first output terminal being connected to the first electrode of the transistor for deriving an output signal therefrom;
means for setting the load lines of the transistor to a first operating point wherein, for each of a first condition in which all of the three input signals are at a low level and a second condition in which two of the input signals are at a high level and a third of the input signals is at a low level, the current conducted by the transistor is at a first level, and to a second operating point wherein, for each of a third condition in which only one of the input signals is at the high level and the remaining two input signals are at the low level and a fourth condition in which all of the three input signals are at the high level, the current conducted by the transistor is at a second level, greater than the first level; and
means connecting the second output terminal to the second electrode of the transistor for deriving and producing a corresponding output voltage at the output terminal, the output voltage having a first voltage level when the number of the respective input signals, received by the three input terminals, having the high level is zero or one and the output voltage having a second voltage level, higher than the first voltage level, when the number of the respective input signals, received by the three input terminals, having the high level is two or three.

18. A logic circuit as recited in claim 17, wherein:
the diode has a current-versus-voltage characteristic having a peak in a first voltage range and a valley in a second voltage range higher than the first voltage range; and
the connecting means comprises a discrimination circuit which connects the output terminal to the second electrode of the transistor, the discrimination circuit establishing a discriminating voltage having a voltage level intermediate the first and second voltage ranges, and discriminating the voltage derived from the second electrode of the transistor relatively to the discriminating voltage and producing the output voltage, correspondingly and selectively of the first and second voltage levels.

19. A logic circuit as recited in claim 17, wherein said transistor comprises a bipolar transistor.

20. A logic circuit as recited in claim 17, wherein said transistor comprises a field effect transistor.

21. A logic circuit as recited in claim 17, wherein said transistor comprises a static induction transistor.

22. A logic circuit as recited in claim 17, wherein said N-type diode comprises a resonance tunnel diode.

23. A logic circuit as recited in claim 17, wherein said N-type diode comprises an Esaki diode.

24. A logic circuit as recited in claim 17, wherein said N-type diode comprises a real space transition type differential characteristic resistance element.

25. A logic circuit having high and low potential power supply terminals, three input terminals for receiving three respective input signals, each of the input signals having, selectively, either a high voltage level or a low voltage level, and an output terminal, comprising:
a transistor having first and second electrodes and a control electrode;
first, second and third resistors respectively connecting the control electrode of the transistor to the three input terminals;
a fourth resistor connecting the first electrode of the transistor to the high potential power supply terminal;
a fifth resistor connecting the control electrode of the transistor to the low potential power supply terminal;
a diode, having N-type negative differential resistance, connecting the second electrode of the transistor to the low potential power supply terminal;
the output terminal being connected to the connection of the second electrode and the diode; and
the voltage-versus-current characteristics of the transistor and the diode and the values of the resistors being selected, relatively to the voltage levels of the first, second and third input signals and the values of the high and low potential power supplies, so as to set the load lines of the transistor at selected, different values respectively corresponding to, and in response to, the respective, high or low voltage levels of the three input signals respectively received at the three input terminals and supplied through the respective first, second and third resistors to the control electrode of the transistor.

26. A logic circuit having high and low potential power supply terminals, three input terminals for receiving three respective input signals, each of the input signals having, selectively, either a high voltage level or a low voltage level, and an output terminal, comprising:
a first transistor having first and second electrodes and a control electrode;
first, second and third resistors respectively connecting the control electrode of the first transistor to the three input terminals;
a fourth resistor connecting the first electrode of the first transistor to the high potential power supply terminal;
a fifth resistor connecting the control electrode of the first transistor to the low potential power supply terminal;
a diode, having N-type negative differential resistance, connecting the second electrode of the first transistor to the low potential power supply terminal;
the output terminal being connected to the connection of the second electrode and the diode;
a second transistor having a control electrode connected to the second electrode of the first transistor and having first and second electrodes, the second electrode being connected to the low potential power supply terminal;
a sixth resistor connecting the first electrode of the second transistor to the high potential power supply terminal;
the output terminal being connected to the connection of the sixth resistor and the first electrode of the second transistor; and
the voltage-versus-current characteristics of the first transistor and the diode and the values of the resistors being selected, relatively to the voltage levels of the first second and third input signals and the values of the high and low potential power supplies, so as to set the load lines of the first transistor at selected, different values respectively corresponding to, and in response to, the respective, high or low voltage levels of the three input signals respectively received at the three input terminals and supplied through the respective first, second and third resistors to the control electrode of the first transistor and so as to set a voltage threshold value of the second transistor intermediate the corresponding voltage values of the selected, different load lines of the first transistor.

* * * * *

UNITED STATES PATENT AND TRADEMARK OFFICE
CERTIFICATE OF CORRECTION

PATENT NO. : 5,281,871
DATED : January 25, 1994
INVENTOR(S) : MORI et al.

It is certified that error appears in the above-indentified patent and that said Letters Patent is hereby corrected as shown below:

Col. 1, line 67, after "scarcely" delete ".".

Col. 12, line 25, change "terminals" to --terminal--.

Signed and Sealed this

Fourth Day of October, 1994

Attest:

BRUCE LEHMAN

Attesting Officer

Commissioner of Patents and Trademarks